US 6,732,908 B2

(12) United States Patent
Furman et al.

(10) Patent No.: US 6,732,908 B2
(45) Date of Patent: May 11, 2004

(54) HIGH DENSITY RAISED STUD MICROJOINING SYSTEM AND METHODS OF FABRICATING THE SAME

(75) Inventors: Bruce Kenneth Furman, Fishkill, NY (US); Maheswaran Surendra, Croton-On-Hudson, NY (US); Sherif A. Goma, Hawthorne, NY (US); Simon M. Karecki, deceased, late of Poughkeepsie, NY (US); by Anna Karecki, legal representative, Brooklyn, NY (US); John Harold Magerlein, Yorktown Heights, NY (US); Kevin Shawn Petrarca, Newburgh, NY (US); Sampath Purushothaman, Yorktown Heights, NY (US); Carlos Juan Sambucetti, Croton-On-Hudson, NY (US); Richard Paul Volant, New Fairfield, CT (US); George Frederick Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 10/052,591

(22) Filed: Jan. 18, 2002

(65) Prior Publication Data

US 2003/0136814 A1 Jul. 24, 2003

(51) Int. Cl.[7] .......................... B23K 31/02; H01L 23/52; H01L 21/44
(52) U.S. Cl. ................. 228/180.22; 228/215; 257/737; 438/613
(58) Field of Search ................. 228/180.21, 180.22, 228/180.5, 245, 246, 215; 257/777, 784, 737, 738; 438/613

(56) References Cited

U.S. PATENT DOCUMENTS

| 3,458,925 A | * | 8/1969 | Napier et al. ................ 438/613 |
| 3,942,245 A | * | 3/1976 | Jackson et al. ................ 29/827 |
| 4,413,308 A | * | 11/1983 | Brown ........................ 361/749 |
| 5,348,214 A | * | 9/1994 | Nishiguchi et al. ..... 228/180.22 |
| 5,668,405 A | * | 9/1997 | Yamashita .................. 257/668 |
| 6,020,561 A | * | 2/2000 | Ishida et al. ................. 174/261 |
| 6,107,180 A | * | 8/2000 | Munroe et al. ............. 438/613 |
| 6,153,490 A | * | 11/2000 | Xing et al. .................. 438/396 |
| 6,180,881 B1 | * | 1/2001 | Isaak ......................... 174/52.4 |
| 6,285,562 B1 | * | 9/2001 | Zakel et al. ................. 361/768 |

(List continued on next page.)

FOREIGN PATENT DOCUMENTS

| DE | 019830159 A1 | * | 1/2000 |
| JP | 363175450 A | * | 7/1988 |

OTHER PUBLICATIONS

Richard Volant, Kevin Petrarca, Peter Locke, James A. Tornello and Donald F. Canaperi, Tittle: "Replated Metal Structures for Semiconductor Devices", U.S. patent application Ser. No. 09/657,469, filed on May 9, 2000.

*Primary Examiner*—Kiley Stoner
(74) *Attorney, Agent, or Firm*—Ohlandt, Greeley, Ruggiero & Perle, L.L.P.; Daniel P. Morris

(57) ABSTRACT

A microjoint interconnect structure comprising a dense array of metallic studs of precisely controllable height tipped with a joining metallurgy. The array is produced on a device chip that is to be attached to a carrier, or to a carrier along with other devices, some of which may be selected to have similar interconnect structures so as to form all together an assembled carrier that functions as a complete computing, communications or networking system.

15 Claims, 5 Drawing Sheets

U.S. PATENT DOCUMENTS

| | | | |
|---|---|---|---|
| 6,339,024 B1 | 1/2002 | Petrarca et al. | 438/686 |
| 6,344,125 B1 | 2/2002 | Locke et al. | 205/118 |
| 6,358,832 B1 * | 3/2002 | Edelstein et al. | 438/612 |
| 6,368,484 B1 | 4/2002 | Volant et al. | 205/220 |
| 6,476,463 B1 * | 11/2002 | Kaneko et al. | 257/660 |
| 6,525,275 B1 * | 2/2003 | Asai | 174/255 |
| 6,534,863 B2 * | 3/2003 | Walker et al. | 257/737 |
| 2002/0043466 A1 * | 4/2002 | Dordi et al. | |
| 2002/0111010 A1 * | 8/2002 | Walker et al. | |
| 2003/0049886 A1 * | 3/2003 | Salmon | |
| 2003/0092254 A1 * | 5/2003 | Walker et al. | |
| 2003/0122206 A1 * | 7/2003 | Bhattarai et al. | |
| 2003/0136813 A1 * | 7/2003 | Magerlein et al. | |
| 2003/0136814 A1 * | 7/2003 | Furman et al | |
| 2003/0137058 A1 * | 7/2003 | Magerlein et al. | |

* cited by examiner

HIGH DENSITY RAISED STUD MICROJOINING SYSTEM AND METHODS OF FABRICATING THE SAME

FIELD OF THE INVENTION

This invention pertains to the field of microelectronics, and more particularly to the field of fabricating extremely small semiconductor devices and current, commonly referred to as "chips."

RELATED INVENTIONS

The present invention is related to certain inventions assigned to the assignee of the present invention. These are in co-pending U.S. patent application Ser. Nos. 10/052,619 and 10/052,629.

BACKGROUND OF THE INVENTION

Increased levels of integration in the silicon transistor technology over the last two decades have facilitated the migration from large scale integrated (LSI) to very large scale integrated (VLSI) and now to ultra-large scale integrated (ULSI) circuits for use in silicon chips for computing, communication and micro controller applications. Optimum utilization of these highly integrated silicon chips requires a more space efficient packaging with supporting devices such as memory chips. Further, with the advent of mobile communication devices, hand held organizers and computing devices, there has also been a push to integrate such varied functions into a single compact system. This in turn has led to the push in the microelectronics industry towards system-on-a-chip (SOC) approach.

Simply stated, the SOC approach attempts to integrate as many of these different device functionalities on the same silicon chip so that a single large chip can provide a variety of functions to the end user. Although conceptually very attractive such an approach is practically daunting due to several reasons. First, the materials, fabrication processes and feature sizes optimum for the different microelectronic devices (such as memory chips, logic chips, wireless communication chips, etc.) are quite different from each other. Combining them all onto the same chip implies making compromises that can limit the performance achievable in each of the device blocks in the SOC. Second, integration of a large number of functional blocks requires a large chip size with many levels of wiring constructed on the chip. Both these factors tend to reduce the yield and increase the cost per chip, which is undesirable. Third, one has to design and build every unique combination of functions (e.g., memory and microprocessor, wireless communication and microprocessor, etc.) leading to a large variety of chip part numbers and product mix that is not conducive to cost reduced manufacture. Last, the expertise required for combining a diverse set of materials, process and integration schemes on a single SOC is often not available in a single enterprise as these are currently part of different microelectronic businesses.

An attractive alternative to SOC is system-on-a-package or SOP wherein a number of chips, each optimized for its unique function and perhaps manufactured in different factories specially tailored to produce the specific chips are combined on a first level packaging carrier that interconnects them and allows the resulting package to function as a single system. The level of interconnection and input-output- (I/O) density required in such a package is expected to be far greater than those currently available in printed circuit board or multilayer ceramic technologies. Since this SOP carrier with chips assembled on it is expected to replace an SOC, it is reasonable to expect that the interconnect and I/O densities should be somewhere between those used in the far back end of the line (FBEOL) interconnect levels on chips (typically wiring and vias on 500 nm to 1000 nm pitch) and the most aggressive packaging substrates (typically vias and wiring on 10,000 to 20,000 nm pitch). Extension of the FBEOL processes at the required wiring size and pitch for the SOP carrier is feasible if the carrier itself is made of silicon. In addition, however, the carrier would be required to support a high I/O density in order to interconnect the various device chips mounted on it. Greater the granularity of the system, that is, finer the division of the system into sub-units or chips, greater will be the number of I/Os required. It is expected that such I/O densities will necessitate bonding pads that are on the order of 5 to 10 $\mu$m size and spaces which are presently outside the realm of possibility of typical packaging I/O pads which are at least 10 to 20 times coarser in size and spacing.

It is therefore highly desirable to enable a microjoining structure to interconnect several chips on to a system-on-a-package carrier to achieve significantly higher input/output density between the chips as compared to the current state-of-the-art.

Accordingly, in order to overcome the inability of the prior art to produce a high-density array of I/O interconnects, it is the primary object of the present invention to provide a microjoint interconnect structure that will enable the use of chip processing techniques for the device chips and for the carrier such that the scheme will allow a very high density of interconnects, for example below 10 $\mu$m pitch, down to the very small 10-micron pitch, which is a much higher density than is possible with conventional chip to carrier joining.

SUMMARY OF THE INVENTION

In fulfillment of the above-stated objects, the present invention provides a microjoint interconnect structure comprising a dense array of metallic studs of precisely controllable height tipped with a joining metallurgy. The array is produced on a device chip that is to be attached to a carrier, or to a carrier along with other devices, some of which may be selected to have similar interconnect structures so as to form all together an assembled carrier that functions as a complete computing, communications or networking system.

The high density afforded by the use of chip processing methods and the controlled height of the studs enabled by a lithographic and chemical-mechanical polishing (CMP) process combination are unique to the invention. The carrier can be a silicon wafer, a ceramic substrate, or an organic chip carrier, although the silicon carrier is preferred since it allows the greatest microjoint density, low thermal expansion, and a high degree of planarity. The joining pads on the carrier are designed to be slightly larger than the stud structures and are provided with a recessed geometry so that the studs can slide into position and be contained within the carrier pads. Alternatively, the studs may be fabricated on the carrier and the recessed joining pads on the device chips.

The foregoing and still further objects and advantages of the present invention will be more apparent from the following detailed explanation of the preferred embodiments of the invention in connection with the accompanying drawing.

DESCRIPTION OF PREFERRED EMBODIMENTS

Figure 1:
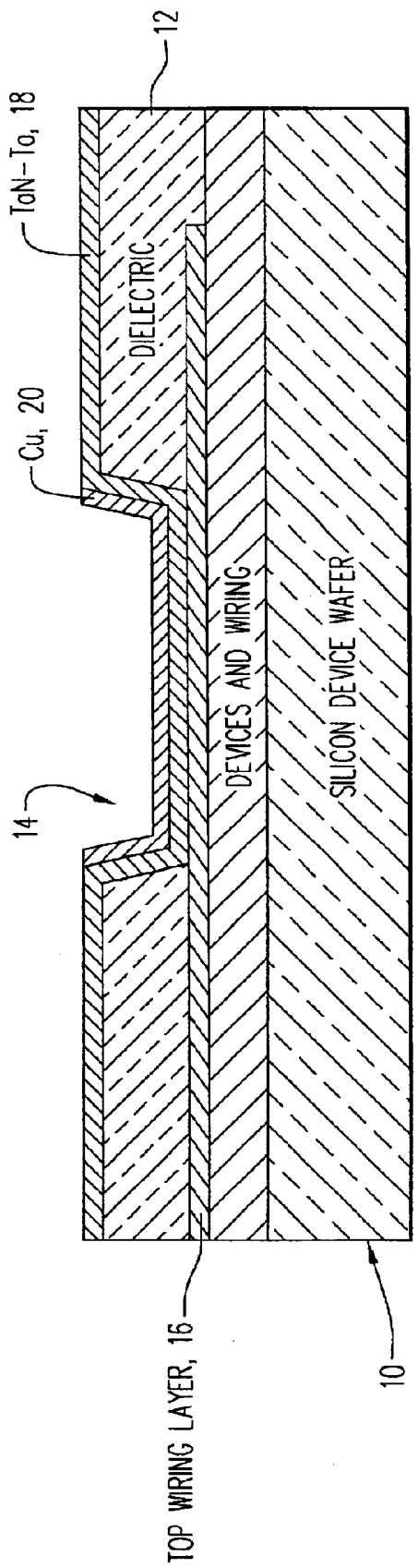
FIG. 1 is a sectional view of a device wafer with a receptacle extending down to the top wiring layer in a dielectric layer.

Referring now to the Figures of the drawing, the device wafer process will first be described with several options or embodiments. Then, the carrier process flow is described to complete the structure being formed.

Figure 2:
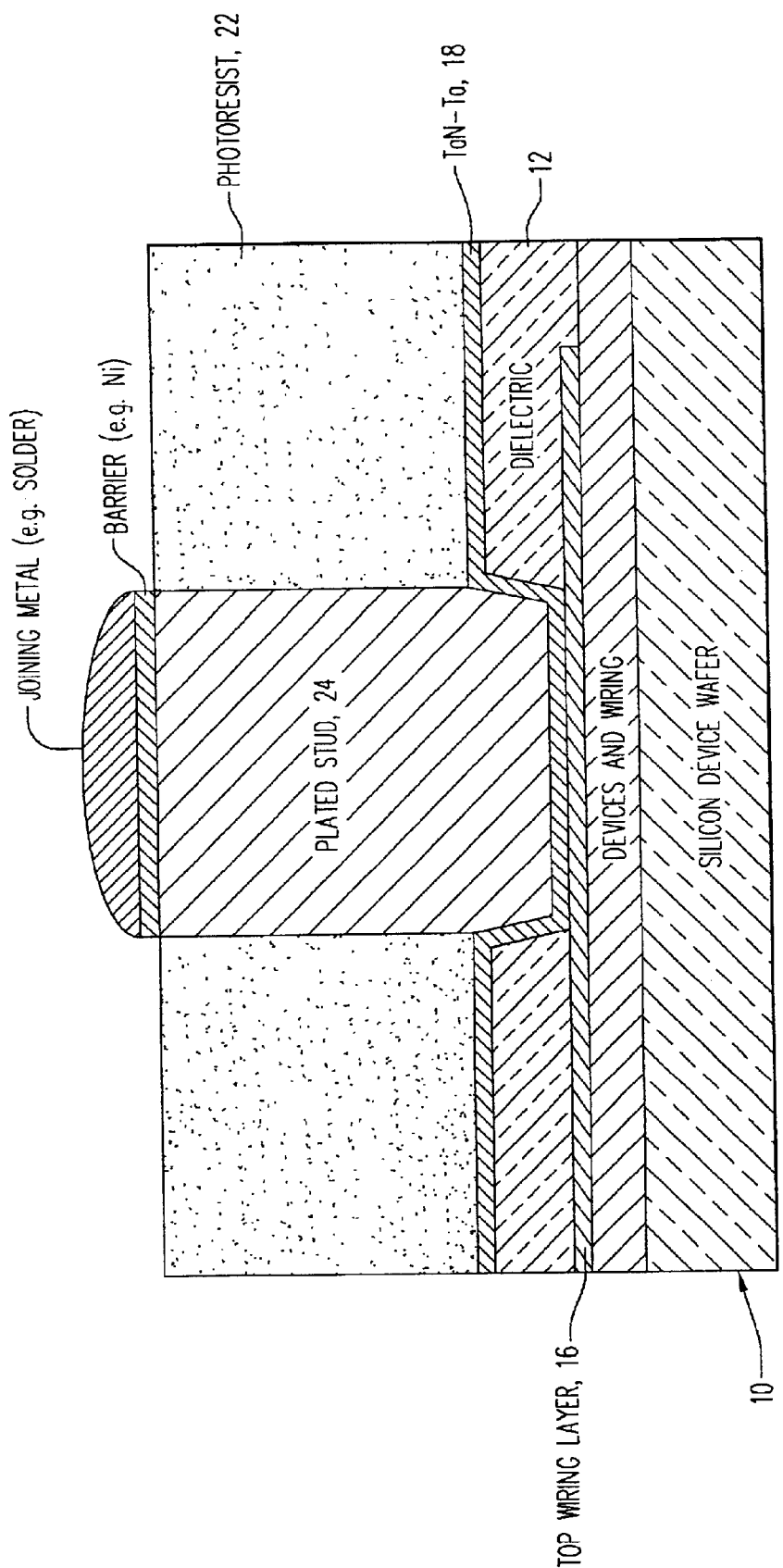
FIG. 2 is a sectional view of the device wafer of FIG. 1, but with an additional resist layer having a plated stud therethrough.

Above the last level of interconnect wiring layer 16 on the device chip wafers, a top passivation stack 12 dielectric layer is applied and contact holes, serving to house receptacles or sockets 14, are formed to provide access to the contact sites on the last metal level. Then, TaN/Ta layer 18 and Cu layer 20 are deposited on top of the structure and the copper is removed from the top surface of the carrier by CMP, stopping on the Ta. This results in Cu 20 being present only at the bottom and side walls of the receptacles, as shown in FIG. 1. A photoresist layer 22 (FIG. 2) is applied and patterned to have openings coincident with the contact holes. The size of these openings can be equal to or greater than the diameter of the contact holes. The thickness of the resist is chosen in accordance with the final height desired for the copper stud 24. A metal such as Cu is electroplated through the openings using the copper seed in the contact holes as the seeding area. After slight overplating to ensure all openings in the resist are filled, CMP of the Cu is done, stopping on the resist. As a result, the copper studs 24 with a predetermined height are realized.

At this point, the process can continue in different ways to produce slightly different end structures:

Option 1: Copper stud fully coated with a barrier layer

Strip resist, electroplate Ni, immersion Au (plating occurs only on Cu studs since Ta surface does not plate readily); electroplate solder or tin and etch TaNTa from the area between studs by wet or dry methods.

OR

Figure 3A:
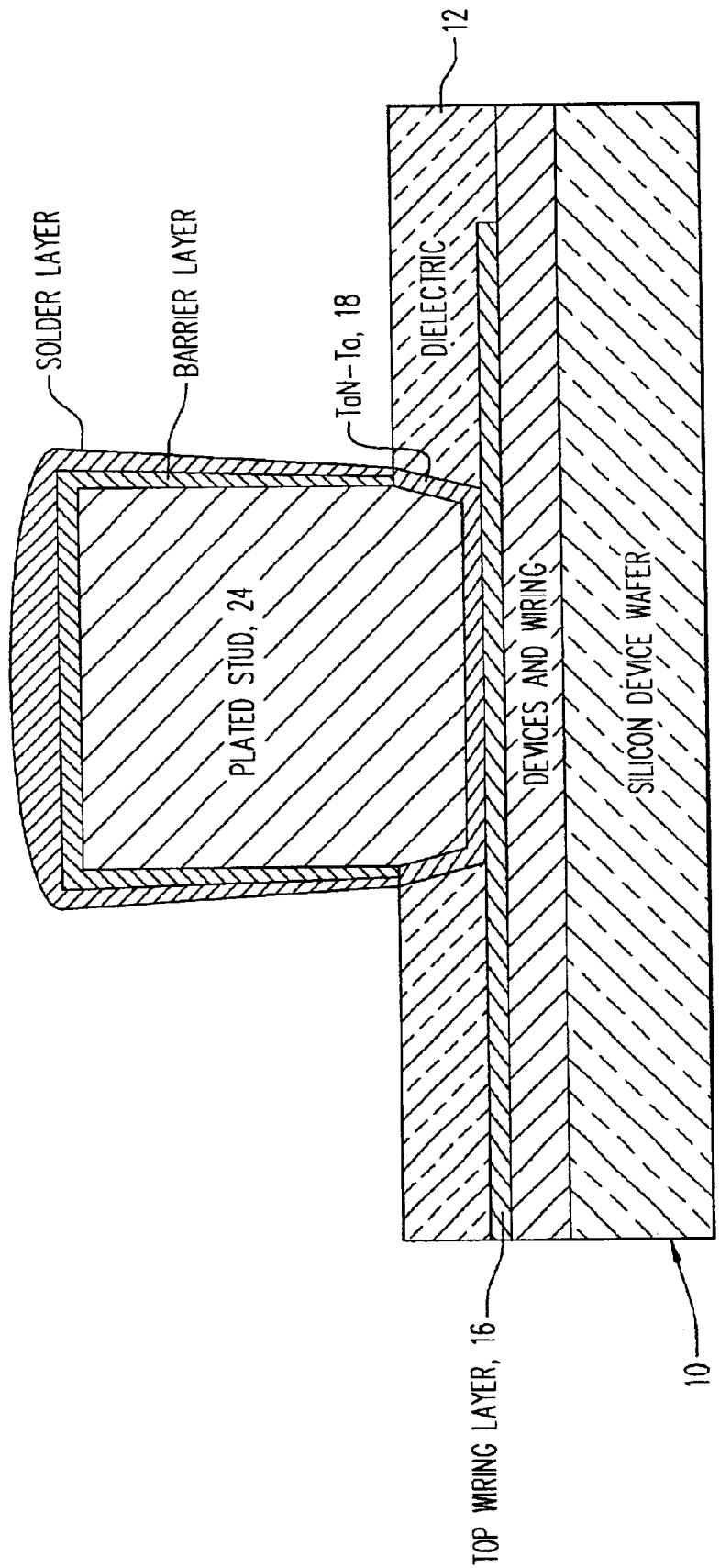
FIG. 3a is a sectional view of the combination of device wafer and stud of FIG. 2 but with the resist removed. And the copper stud is fully passivated with a barrier layer, noble metal layer and a solderable joining layer.

Strip resist, deposit electroless Ni—P, immersion Au (plating occurs only on Cu since the electroless and immersion steps are selective for Cu), electroplate solder or Sn and etch TaN, Ta from the area between the studs by wet or dry methods, resulting in a structure shown in FIG. 3a.

OR

Strip resist, etch TaN Ta, electroless Ni—P, immersion Au and Sn (same as above)

One can use an optional electroless CoWP layer as an added diffusion barrier between Cu and Ni if that is required.

Option 2: Copper stud capped only at the tips with a barrier layer

Electroplate Ni, immersion Au, electroplate solder or tin. Strip resist and etch TaN, Ta.

OR

Electroless Ni—P, immersion Au, electroplate solder or Sn. Strip resist and etch TaNTa.

Figure 3B:
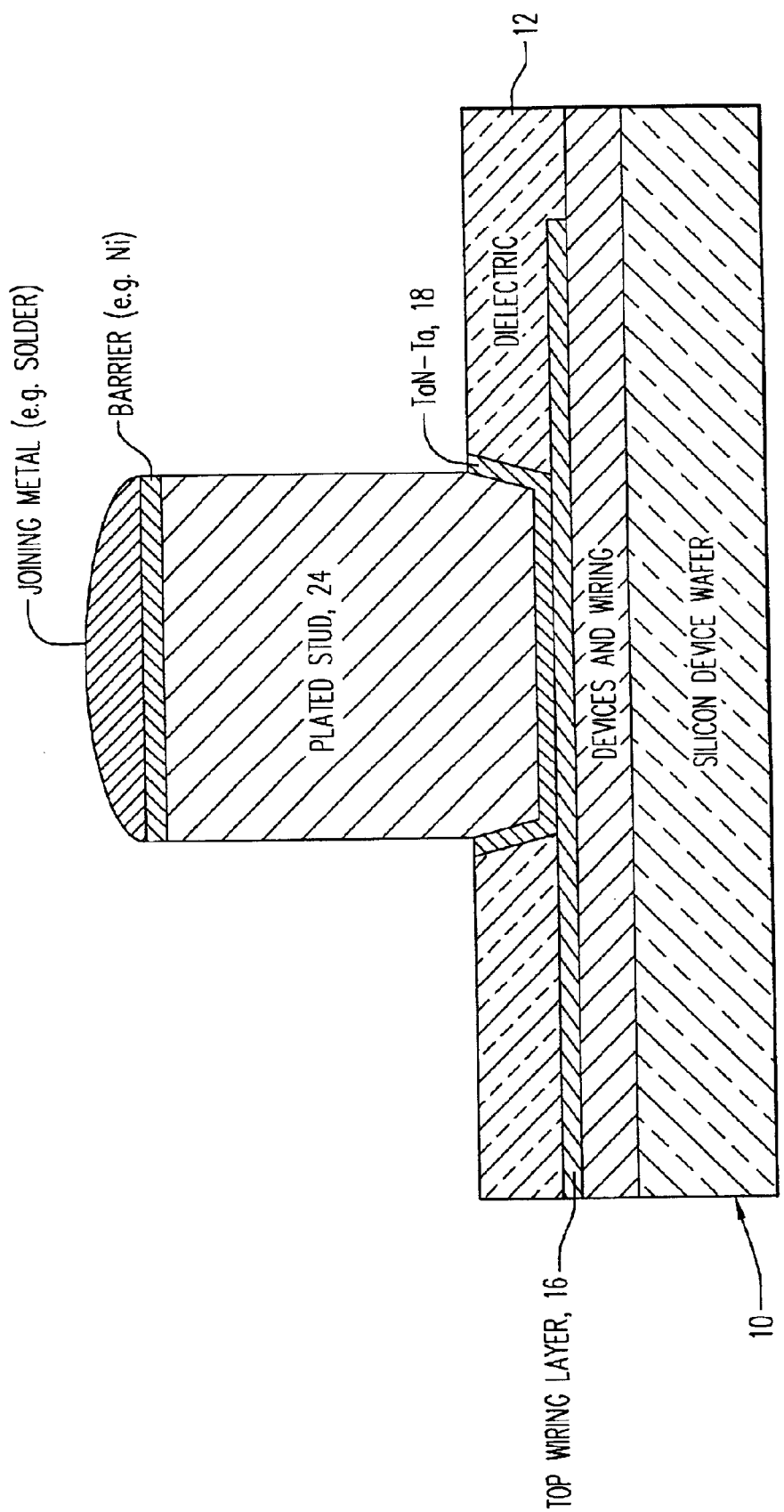
FIG. 3b is a sectional view of the combination of the device wafer and the stud after capping of the stud tips with a barrier metal, noble metal and a joining metal layer.
Figure 4:
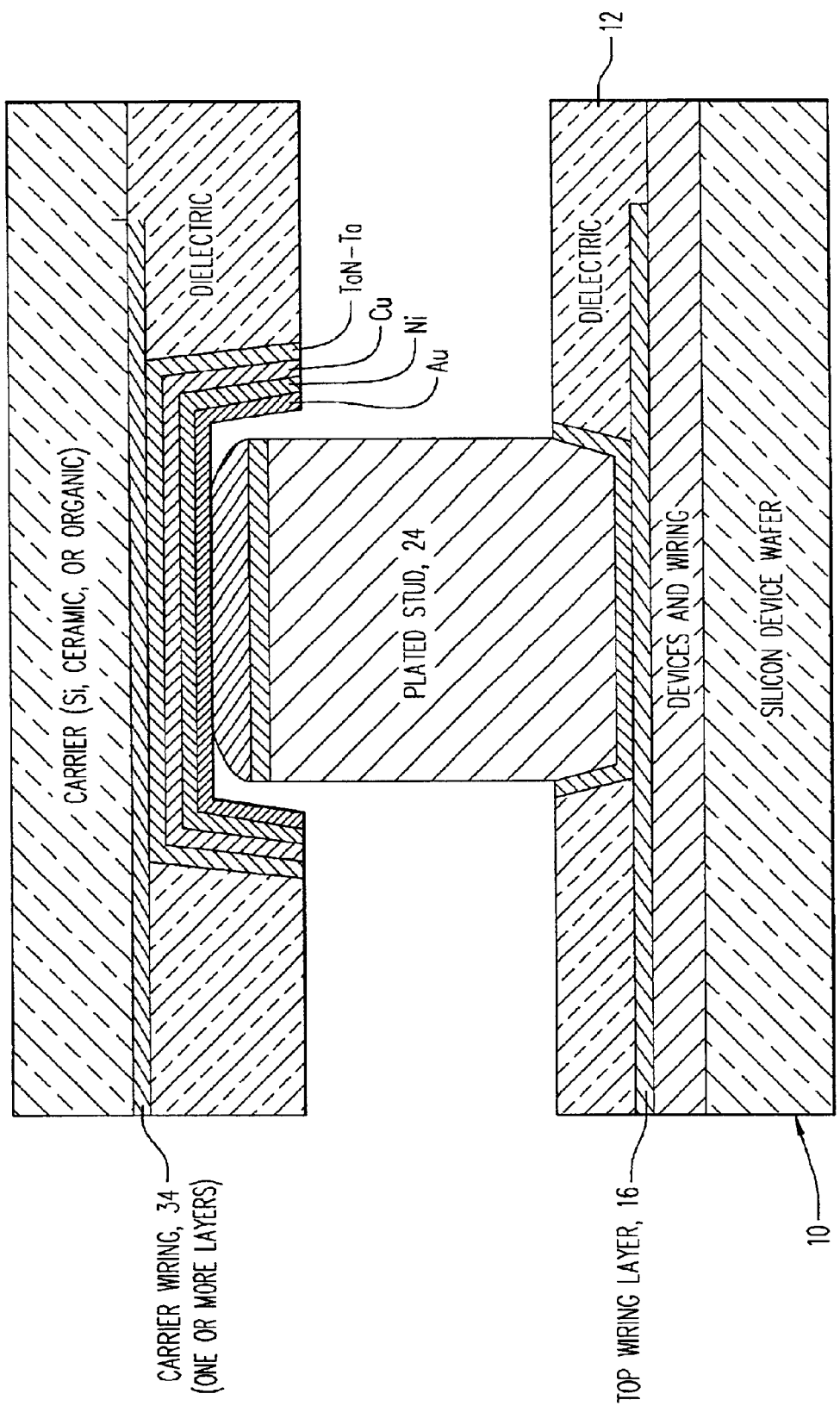
FIG. 4 is a sectional view of the combination of device wafer and stud of FIG. 3b, but with the wafer aligned to a carrier with socket or receptacle in the carrier having appropriate contiguous metal layers.

This structure is desired if the joining materials need to be confined to the stud tip only, and the resulting structure is shown in FIG. 3b.

Alternate methods, or portions of the process flow, may be employed which are described in dockets FIS920000015US1 (Replated Metal Structures . . . ) and FIS919990197US1 (Pattern-Sensitive Electrolytic Metal Plating). In these methods the formation of the pads desired on the upper surface is determined by the presence or absence of metal features in the layers that lie underneath the intralevel dielectric due to electric field perturbations. This is a limitation in that the top layer pattern cannot be generated independent of the pattern of the underlying metal levels. Other films such as Ti, W, TiN, WN, Cr or combinations thereof can be substituted for Ta and TaN, and Ni can be replaced by Co, Pt or Pd.

The carrier process flow comprises:

1. Start with a silicon, ceramic, or organic carrier with interchip wiring as well as wiring and contacts to connect to external electronics. The wiring may have multiple levels and the carrier may have vias through it to allow for connections to the back.
2. Form vias in the upper dielectric layer where contacts to the device chips will be made.
3. Deposit a liner/seed layer such as TaN—Ta (about 40 $\mu$m) and Cu (about 100 $\mu$m).
4. CMP off the Cu from the surface and stop on Ta. Cu is left in the bottom of the contact depressions and their side walls.
5. Electroplate a barrier layer such as 0.5 micron of Ni into the contact openings using a process that plates only on Cu. The TaN—Ta layer serves to bring in the current, but no plating takes place on it.
6. Electroplate a noble metal such as thin Au (about 0.1 micron) or apply immersion Au on the Ni surface. The latter may be simpler and more controlled in thickness (800 to 1200A). The former leads to an all electroplated sequence. Also, the immersion Au solution, which usually contains cyanide, can be replaced by an electroless Au, non-cyanide bath which is very selective to Ni and which can be deposited in a very short time (2 minutes) rather than having to expose the piece for 30 minutes in immersion Au.
7. Etch the TaN—Ta layer by a wet or dry etch process. Other metals such as Ti, W, TiN, WN, Cr or combinations thereof can be substituted for Ta and TaN, and Ni can be replaced by Co, Pt or Pd.

The assembly involves a pick and place process of the chiplets in a manner similar to the regular flip chips (split optics and/or capacitance aligned) followed by reflow joining. A hydrogen reflow without flux may be preferred when the gap between the chiplet and the carrier is too small for efficient flux cleaning.

Some of the unique advantages of the resulting structure are:

1. The use of chip processing techniques for the device chips as well as the carrier allows a very high density of interconnects down to a 10-micron pitch. This is a much higher density than is possible with conventional chip to carrier joining. Higher density down to a 2.5-micron pitch is feasible if required.

2. The structure can be tailored to have a high stand off height to accommodate variations in the planarity of the carrier substrate.

3. The height of the interconnects can be selected to reduce thermal mismatch related shear strains in the microjoints since these strains scale inversely with the joint height.

4. Taller microjoints can also be used to create an adequate separation between the chip and the carrier so that a suitable underfill material can be injected and cured in the gap. This is required if the thermal expansion mismatch between the chip and the carrier is large and the chip size is large (typically 10 mm on edge or more). The underfill acts as a reinforcement and reduces the stresses experienced by the joints.

5. The flexibility in choosing the height can also be used to ensure that the back surfaces of the flip mounted collection of devices are reasonably coplanar even when the joining pads may have different heights in different chips (e.g., large flip chip solder in one chip versus ultra high pitch microjoints in another, the stud height can be used to equate the joint heights in both cases). This coplanarity is important if a common surface for heat removal is needed on the back of the chips as in the case of the heat sink attachment to a high performance processor system.

6. The joining metallurgy on the stud tips can be Pb-based solder, Pb-free solder or AuSn alloy. In the latter two cases, the joint will be free of alpha particle issues related to the solder since there is no lead in the joints close to the device chips.

The invention having been thus described with particular reference to the preferred forms thereof, it will be obvious that various changes and modifications may be made therein without departing from the spirit and scope of the invention as defined in the appended claims.

What is claimed is:

1. A system for connecting a set of device chips by attaching them by means of a microjoint structure comprising:
    a microjoint chip carrier including a multilayer substrate having a plurality of receptacles in its top surface;
    a set of microjoint pads on the device chips including conductive studs extending outwardly above the surface of said pads, the studs being individual non-fusible posts formed to match in spatial location with each of the respective receptacles on said chip carrier; and
    interconnect wiring in said carrier connecting the carrier receptacles so as to allow the interconnection of said set of device chips.

2. A system according to claim 1 wherein said conductive studs have a cap layer of a fusible solder at their top surface to enable bonding.

3. A system as defined in claim 1 wherein the interior of the receptacles in the carrier are lined with contiguous layers of liner, seed, barrier metal and noble metal films.

4. A system as in claim 3 wherein the liner layer is selected from the group consisting of W, Ta, Ti, WN, TaN, TiN, Cr or combinations thereof.

5. A system as in claim 3 wherein the seed layer is copper.

6. A system as in claim 3 wherein the barrier layer is selected from the group consisting of Ni, Co, Pt, Pd, Ni—P, Co—P, CoWP.

7. A system as defined in claim 1, wherein the carrier includes a layer of silicon and a dielectric layer, the receptacles being in the dielectric layer, and the carrier wiring being below the dielectric layer.

8. A system as defined in claim 3, wherein the liner layer initially extends over the dielectric layer and into the receptacles, but is then limited to the receptables.

9. A system as defined in claim 3, wherein the seed layer is limited to the receptable.

10. A process for interconnecting a set of device chips by attaching a microjoint structure comprising:
    forming the microjoint structure by building a carrier in the form of a multilayer substrate having a plurality of receptacles in its top surface;
    forming a set of microjoint pads including conductive studs in the form of non-fusible posts extending outwards from the pads;
    matching and joining the pads on the device chips to the receptacles on the carrier, and
    forming interconnect wiring that connects the carrier receptacles.

11. A process as defined in claim 10 including the step of forming pads at the ends of studs extending from the semiconductor wafer.

12. A process as defined in claim 10 including the step of forming contiguous layers of tantalum, copper and nickel at the peripheries of the receptacles in the top surface of the carrier.

13. A process as defined in claim 10, wherein the carrier includes a layer of silicon and a dielectric layer, the receptacles being in the dielectric layer, and the carrier wiring being below the dielectric layer.

14. A process as defined in claim 11, including the step of etching away the tantalum layer from the top surface of the dielectric layer.

15. A process in accordance with claim 11, including the step of etching away the copper from the top surface of the dielectric layer.

* * * * *